United States Patent [19]

Blumenaus

[11] 4,159,892
[45] Jul. 3, 1979

[54] METHOD OF PRINT DYEING TEXTILE MATERIALS FROM A PHOTOGRAPH AND PRODUCTS MADE THEREFROM

[75] Inventor: Jon M. Blumenaus, Dalton, Ga.

[73] Assignee: World Carpets, Inc., Dalton, Ga.

[21] Appl. No.: 829,250

[22] Filed: Aug. 30, 1977

[51] Int. Cl.² .......................... G03C 5/00; G03F 5/00
[52] U.S. Cl. .......................................... 8/62; 8/1 XB; 96/36.4; 96/41; 96/116; 101/128.3
[58] Field of Search .................. 8/62, 1 XB; 96/36.4, 96/41, 116; 101/128.3

[56] References Cited

U.S. PATENT DOCUMENTS

| 3,381,612 | 5/1968 | Lecha | 96/30 |
| 3,532,495 | 10/1970 | Simm et al. | 8/2.5 |
| 3,966,396 | 6/1976 | Howes et al. | 8/2.5 A |

Primary Examiner—A. Lionel Clingman
Attorney, Agent, or Firm—Cameron, Kerkam, Sutton, Stowell & Stowell

[57] ABSTRACT

A method for preparation of the final film used for engraving a flat screen, belt screen or rotary screen for a printing machine. The final film is prepared from a photograph of the image to be reproduced and engraved by known techniques on a screen so as to provide a continuous repetitive pattern on the face of a pile fabric dyed in a continuous print dyeing process.

Select areas of photographic images are montaged and put into a repeat pattern within a predetermined outline to establish the basic repeat. Four continuous tone color separations are made of the selected pattern to provide yellow, blue, red and black continuous tone negatives which represent the four colors of the original image. Each color separation is posterized and half toned to provide eight positive films. The films are selectively combined, blown up to the desired repeat size to provide a negative or positive which is used to prepare a flat bed screen or rotary screen for an otherwise conventional printing process.

4 Claims, No Drawings

METHOD OF PRINT DYEING TEXTILE MATERIALS FROM A PHOTOGRAPH AND PRODUCTS MADE THEREFROM

BACKGROUND OF THE INVENTION

1. Field of the Invention

This invention relates to print dyeing of flat materials wherein it is desired to produce an image thereon which gives a three dimensional effect appearance.

While the invention has applicability to print dyeing of all types of materials, textile fabric and flat piece materials such as, for example, upholstery fabric, sheets, drapery, flat work, formica, ceramics, china, and the like, the invention is particularly applicable to print dyeing a pile fabric materials, such as, carpeting and rugs, wherein the dye penetrates the surface of the face yarns and a continuous image is formed on the surface of the pile yarns in a continuous print process.

2. Description of the Prior Art

Recent styling trends in tufted carpet involve color printing of the carpet pile on a greige background or on a single predyed background color. Silk screens, flat bed screens, belt screens or rotary screens are commonly employed to produce a variety of repetitive printed color patterns on carpeting and other pile fabrics. Ever-changing public tastes have created demands for new and unusual color patterns in pile carpeting.

Prior art machines are known for printing of carpet pile to produce varying and non-montonous designs in one or more colors. However, the machines and techniques employed have not been satisfactory in that the resulting patterns are generally the work of individual artists who design a particular pattern from which a screen is made, much the same way a painter prepares and paints an oil painting. Accordingly, each style or design is thus subject to and limited to the artist's ability.

Printed screens used in the carpet industry are not readily adapted for printing fine detail obtainable by photographic methods. To this end, the mesh size of carpet printing screens generally contains about 60–74 openings per inch. A conventional half tone screen used to form half tone positive film normally contains about 50–150 lines. For the general run of letterpress printing, screen sizes of 65–88 are commonly used depending primarily on the smoothness of the surface of the paper on which the halftone is printed. The smoother the surface, the finer the screen.

In applying photographic techniques to carpet printing, I have found that several factors directly affect the capability of drying. First, carpet surfaces are relatively rough tending to resist even application of dye and penetration when printing extremely fine detail. Secondly, the thickness of printing screens for rotary printer applications tend to build up and fill in the holes. In flat bed screens, the application of lacquers tends to, again, build up in the extremely fine hole areas. As a result, fine detail printing becomes difficult to achieve. Attempts to overcome this drawback and impart more realism into patterns have resorted to the interaction of computers and optical scanning techniques to reproduce an image the face of a fabric corresponding to a selected photograph, artwork or other type of graphic material. Such processes are extremely expensive.

It is, therefore, a primary object of the present invention to overcome the drawbacks of prior art processes and provide a method of continuously print dyeing textile materials such as pile carpeting which gives a design having a realistic image developed from photographic art work.

SUMMARY OF THE INVENTION

The above and other objects of the pesent invention are accomplished by combining graphic art techniques to the carpet printing process. To this end, the final flat screen, belt screen or rotary screen of the printing machine is developed from a photographic art work which is montaged to develop a desired repeat pattern. From this selected repeat pattern, continuous tone color separations are made which are used to create posterized and half-toned films. The resultant film is selectively combined and blown-up and the blow-up used to prepare the screen for a printing operation.

DESCRIPTION OF THE PREFERRED EMBODIMENTS

The present inventive process has applicability to continuous print dyeing of scenes and images on a variety of products including, but not limited to flat work, textile piece goods and fabrics, pile fabrics and the like, but it is particularly applicable to the dyeing of carpet materials in that it enables the dyeing of designs and patterns on the surface of the face yarns which gives a realism and three dimensional effect not heretofore obtainable by conventional techniques.

In accordance with the present invention, the first step in the design of the carpet is the selection of the subject to be reproduced as a pattern on the carpet. The subject may be any photographable design, picture, scene or the like which would give a pleasing effect to the eye. Having selected the subject, a color photograph of the subject is taken and reproduced. For purposes of illustration, a brick pattern will be used as an illustrative example comprising twelve bricks arranged in four columns and three rows. Because of varying color depth patterns of the individual bricks, when such a subject is used in a repetitive pattern, certain undesirable and offensive effects may result. For example, if two of the bricks in a column were darker in shade or tone than the remaining bricks in the pattern, then over multiple repeats these darker shades or tones would create the appearance of a dark line. To counteract this effect, the photographic reproduction is montaged to form a more uniform color appearance. To this end, the undesirable or offensive parts of the photographic reproduction are cut out and replaced with more sections which are more in character with the color and tone of the balance of the reproduction. The replacement sections may be taken from multiple reproductions of the original photograph; however, to provide a more realistic appearance and three dimensional look, since bricks are seldom alike, and seldom formed in a flat plane, at least two initial photographs of the subject are taken from which the montage is effected. It should be readily apparent that more than two photographs may be used and when multiple photographs of the subject are used, the photographs should be in the same scale.

Having montaged the subject, the next step is to establish a repeat pattern. The repeat must be true not only at the top and bottom of the pattern, but also at the sides so that multiple images of the subject will result in a continuous repetitive pattern without obvious or unnatural breaks in the pattern. To establish the repeat, having in mind that the film from which the screen will be engraved will be a blow-up of the original subject, a section of the montaged photograph is cut out. This section basically shows the pattern which is to be repeated. As a practical matter, only with certain subjects will the repeat be true or continuous without obvious discontinuities. To avoid such discontinuities in the final pattern, the montaged photograph is first cut transversely between its top and bottom edges to form two sections. The sections are now transposed and joined so that the top edge of the original photograph is aligned with the original bottom edge. The new top edge and new bottom edge of the joined sections are true and match so as to present no discontinuities. The line where the original top and bottom edge are joined may present discontinuities in the design, the pattern is touched up by montaging with desired pieces.

The same process is repeated along the vertical to insure side by side matching. The photograph matched along the horizontal is cut from top to bottom and the one side edge joined to the other side edge. Any discontinuities which may be present along the vertically joined edges are touched up by further montaging. There now results a photograph which is a one full pattern repeat of the chosen design.

The next step in the process is to make continuous tone color separation negatives from which four halftones and four posterized films will be made.

Since four continuous tone negatives must be obtained in order to print the proportionate parts of the different colors, the first steps involve breaking down the colored original into four separate photographic images. These are termed separation negatives.

In the process, the original colored photograph, or transparency, is positioned before the lens of a large copying camera.

As an aid to the operator for correctly judging the results, a gray scale is photographed along with the original. This is a strip of paper or film with approximately ten steps in neutral shades of gray from black to white. In properly exposed and developed color-separation negatives, the gray tones will match in all three.

Also registration marks are provided along-side the gray scale.

Over the camera lens is placed an orange-red filter which allows light rays of that color only to pass; thus, the red portions of the original are represented by tones of gray in the negative. In like manner, another piece of film is placed in the camera and another exposure made with a green filter over the lens. This negative now contains the green portion of the original. Again, a third piece of film is exposed through a deep-blue filter, this negative giving a record of the blue areas in the original. Standard process filters used might be Wratten filters A25 (red), B58 (green), and C5-47 (blue).

Typical exposures might be, for a red filter negative, 20 sec; green filter negative, 24 sec; and blue filter negative, 6 sec; Actual exposures would depend upon the lighting, camera settings, and kind of film used. A transmission densitometer may be used for more exact checking of results.

Although it is theoretically possible to print the full range of tones using only the three process colors, a black negative adds detail and contrast to the printed reproduction. To make the separation negative for the black color, the same general procedure used for the other separation negatives is followed. As a filter for this separation, the best choice (called split filter) is to use all three of the previous filters, one at a time, with exposures for each running 50-100% of that used for each filter on the individual separations. Experience and judgment will determine the exact time.

Because the light-transmitting ability of these filters, as well as the sensitivity of the film varies with the color, exposures must be regulated to obtain a set of separations which are properly balanced with each other.

These four continuous tone negatives now represent the masters from which the posterized and half-tone positive will be made.

Posterizing is a known process which achieves a very pleasing presentation of a subject in flat colors. The color tone negatives are shot in one or more exposures on separate pieces of film. Exposures are regulated in that different tones of the original subject appear in contrast as black or clear. A short exposure shows up the dark areas of the subject only, while a long exposure shows up the light aras of the original subject.

From each of the separation negatives a positive half-tone print likewise is made. A positive represents tonal values reversed from those in the negative, so the positive made from the red-filter negative will represent all colors except red, in other words, minus red. White light minus red leaves blue-green, the color in which this positive should be printed; in process work this color is called cyan. The green-filter negative produces a positive which must be reproduced in minus green, which is bluish-red or magenta. The blue-filter negative in turn gives a positive which must be printed as minus blue, or yellow. When the three positives are brought together one over the other in exact alignment, the original subject is recreated.

As each of the screened shots is made, it is necessary to change the angle to the screen ruling. This will allow an optical blending of the different colored dots to give the effect of the colors in the original; it also prevents a moire pattern, which appears when one screened image is printed over another. Usually, screen angles are selected to put the strong color at an angle at least noticeable to the eye, whereas the weaker color is used at the angle most pronounced to the eye. Thus, the black printing plate will be made with the dots running at an angle of 45 (as in the normal black and white halftone), and the yellow printing plate with the dots vertically and horizontally, or 90. Magenta and cyan plate will have the dot angles between the other two, at 75 and 105.

An analysis of all film is made from a selection of both posterized and halftone. Either the halftones may be combined or the posterized film may be combined or combinations thereof may be made to provide a desired visual effect. In accordance with another embodiment of the invention, a half tone film and a posterized film of the same color may be combined so that a new film of that color is created for added visual effects. In the alternative, a negative of one posterized film may be made and superimposed on the positive of another to develop a further negative or a new positive posterized half tone. As can be appreciated, various combinations can be arranged to provide new and unusual visual effects which give three dimensional appearance and styling. After analysis of all film and selection of the desired combination, a color proof is made for viewing. If the proof viewed is satisfactory, the selected combination is blown up or enlarged to its final desired repeat size. This blow up is used to prepare a production flat bed screen, rotary screen or continuous print belt screen by conventional techniques.

To this end, several processes for preparing stencil screens are known. Exemplary of such processes are those described in U.S. Pats. Nos. 2,942,972; 3,407,726; 3,507,651; 3,507,652; 3,507,653; 3,507,654; 3,568,610; and 3,586,609. Other exemplary processes for preparing rotary screens are described and illustrated in U.S. Pats. Nos. 2,387,048; 2,628,903; 2,700,603; 2,811,444; 2,961,315 and 3,610,903. Such screens find ready application in printing machines used for transferring images to a moving web. Machines which have been readily accepted in the carpet industry for the production of multi-color printed carpet are the Zimmer flat bed printer and Zimmer rotry printer. Exemplary descriptions and illustrations of the apparatus and its operation may be found in U.S. Pats. Nos. 3,495,285; 3,565,001; 3,565,003; 3,596,595; 3,807,611 3,811,378; 3,852,980 and 3,998,156. Of course, other forms of printers may be used such as, that illustrated and described, for example in U.S. Pats. Nos. 3,374,731; 3,460,471; 3,304,860; and 3,675,571.

Inasmuch as the foregoing listed patents constitute prior art by which the films made in accordance with the present invention are used to effectuate multi-color print dyeing, the subject matter of said patents is hereby incorporated by reference.

The following example will serve to illustrate the manner in which the present process can be used to develop novel pattern styles for carpets using halftone photographic techniques.

EXAMPLE 1

A level loop pile carpet having a three dimensional appearance was made as follows:

1. First, three photographs were taken of a vertical rock formation. Due to varying color depths within each photograph and the rocks not being in repeat, the photos were cut up and rocks from all three photos were montaged together to form a more uniform color appearance. Also, a repeat was established.

2. The new montaged photograph was then touched up in color with paint to hide joining areas within the rock layout. The pattern repeat was set at 8-⅜inches with approximately a ⅓ dropped pattern to the side. The photograph was then placed perfectly square to camera so that no distortion took place. Registration marks were placed at the four sides of the photograph together with a tone strip and four individual films were shot each with a different set of filters to achieve four continuous tone color separations: Yellow, Red, Blue and Black.

3. These four continuous tone negative films were then photographed onto film once again by means of projecting light through the film and into the camera lens.

4. Using high contrast film (positive) various exposures on posterized shots were taken of each of the four continuous tone films each at a reduced size of 4-13/16 inch square.

5. In addition to posterized shots, various screened halftone film positives were taken, each shot having different dot screen density and each color screened at different angles.

6. After analysis of all film a selection of both posterized and halftone films were made that appeared to have the best effect when combined. A cromalin color proof print was made of one posterized film and the combined Red, Blue, and Black screened films.

7. After viewing the proof print, it was found that some of the montage joinings still showed. Also that areas within the posterized film were a little heavy adn could form repeat lines when several shorts were placed together. Using opaque paint the montage areas were corrected.

8. To balance pattern on posterized film, a less exposed posterized film that had areas within it that would look well substituted into chosen original posterized film. In order to take areas out of one film and substitute them into another a mask was made. Using clear film placed over the original posterized film and less exposed posterized film both in register, new registration holes were punched through these three layers of film. Areas to be taken out of original film were covered with opaque material.

9. To take out unwanted area of less exposed posterized film, an exact negative mask had to be shot onto film on a contact frame, the negative mask also had to be punched for exact registration with positive mask. To achieve a new and balanced posterized film using the best out of both posterized films, a positive unexposed piece of film was punched with registration marks same as all other film and placed upon registration pins on contact frame upon which was registered the original posterized film and then the original positive cut mask. Under glass firmly pressed to the film by vacuum an exposure was made to light. The next step was to take off the mask and posterized film and place new, less exposed posterized film over already part exposed film and on top of the negative mask. Another exposure to light was made. The newly created film was then developed and now consisted of evenly balanced area of density in the stone pattern.

10. To give more depth, yet another posterized film was created as in Step 9. Six films were now chosen as giving the correct effect.

11. The new posterized film of Step 9 was combined with the Yellow halftone screened film and were both shot together as one film.

12. In order to have complete 100% print on carpet, with two screens, a negative of this film was made. This was now a positive film for color 1. Both films when placed together would cover the whole pattern repeat area.

13. At this stage, the films consist of:
Color 1 film (negative as achieved in Step 9;
Color 2 film (posterized and screened films combined as in Step 11;
Color 3 film (new posterized less exposed film as in step 10;
Color 4 film (Red screened film);
Color 5 film (Blue screened film); and
Color 6 film (Black screened film).

Films throughout this stage were at a size of 4-13/16 inches square and in order to see more of what was happening, these were each photographed twice to enlarge to a size of 9 inches square.

14. Two cromalin color proofs were made in color of the following film for general effect:
a. 2, 4, 5 and 6, also
b. Blank blotch, 2, 3 and 5

The final repeat of design for carpet now once again had to be enlarged to its final size of 36 inches square. Due to the need for overlap in carpet printing, without changing pattern repeat size, color 1 film print area was enlarged ⅛ inch all way around each shape. All 6 films (positives) were reshot to negative form for carpet screen engraving. The need for working initially on a small scale is due to the approximately 70 line screen (dots per inch) being too fine for carpet printing. By enlarging the subject shot, say at 4-½ inches with a 70 line screen to 36 inches, this provides approximately 8 dots per inch, which thereby provides the high detail and resolution desired for printing carpet. It should be readily appreciated that the 8 dots per inch ruling, when used with a screen having mesh size of 74 enables the dots to encompass several holes or open squares in the mesh to reproduce the detail captured in the film. Once chosen as a production style, each film repeat edge may have to be carefully touched by hand should a pattern line be otherwise visable.

While a preferred embodiment of the invention has been described, it will be readily apparent to those skilled in the art that various changes thereto may be made without departing from the true spirit or full scope of the invention as defined in the appended claims.

I claim:

1. A method for continuously print dyeing textile fabrics with a continuous pattern wherein the image to be reproduced is taken from a photograph and provides a continuous pattern having a three dimensional appearance on the face of the fabric which comprises setting off a selected area of the photograph to form a pattern within a predetermined outline to establish the basic repeat for the pattern, preparing a plurality of continuous tone color separations of the selected pattern to provide red, green, blue and black continuous tone negatives which represent the colors of the original image, preparing a posterized and half-tone positive of each color separation, combining the posterized and half-tone positives to provide a negative, engraving one or more screens with the combined negative, passing the fabric to be dyed under the engraved screens and selectively applying dye stuff through the screens to reproduce the pattern on the face of the fabric.

2. A method as set forth in claim 1 wherein the fabric is carpet and the face is an upstanding pile yarn.

3. A method for continuously print dyeing flat dyeable textile material with a continuous pattern wherein the image to be reproduced is taken from a photograph and provides a continuous pattern having a three dimensional appearance on the face of the material which comprises setting off a selected area of the photograph to form a pattern within a predetermined outline to establish the basic repeat for the pattern, preparing a plurality of continuous tone color separations of the selected pattern to provide red, green, blue and black continuous tone negatives which represent the colors of the original image, preparing a posterized and a half-tone positive of each color separation, combining the posterized and half-tone positive to provide a positive, engraving one or more screens with the combined positives, passing the material to be dyed under the engraved screens and selectively applying dye stuff through the screens to reproduce the pattern on the face of the material.

4. A method as set forth in claim 3 wherein the material is a floor covering and the face is an upstanding pile yarn.

* * * * *